(12) United States Patent
Xu et al.

(10) Patent No.: US 12,720,228 B2
(45) Date of Patent: Aug. 25, 2026

(54) DETECTING SENSOR DEFECTS FOR THREE-DIMENSIONAL TIME-OF-FLIGHT SENSORS

(71) Applicant: GM Cruise Holdings LLC, San Francisco, CA (US)

(72) Inventors: Zhanping Xu, Sunnyvale, CA (US); Mateusz Monterial, Livermore, CA (US); Kartheek Chandu, Dublin, CA (US); Alexander Lesnick, Alexandria, VA (US); Robert Vets, Seattle, WA (US); Glenn D. Sweeney, Sebastopol, CA (US); Brandon S. Seilhan, San Ramon, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 356 days.

(21) Appl. No.: 18/477,190

(22) Filed: Sep. 28, 2023

(65) Prior Publication Data

US 2025/0113112 A1 Apr. 3, 2025

(51) Int. Cl.
*H04N 25/68* (2023.01)
*H03M 1/12* (2006.01)

(52) U.S. Cl.
CPC .............. *H04N 25/68* (2023.01); *H03M 1/12* (2013.01)

(58) Field of Classification Search
CPC ................................ H04N 25/68; H03M 1/12
See application file for complete search history.

(56) References Cited

U.S. PATENT DOCUMENTS

2012/0173184 A1* 7/2012 Ovsiannikov ........... G01S 17/08 702/97
2021/0096263 A1* 4/2021 Subasingha ........... G01S 17/931

* cited by examiner

*Primary Examiner* — Lin Ye
*Assistant Examiner* — Fayez A Bhuiyan
(74) *Attorney, Agent, or Firm* — CANTOR COLBURN LLP

(57) ABSTRACT

Described herein are systems and techniques for evaluating whether components of a sensing device are functioning properly. An example method includes obtaining a first set of measurements corresponding to a pixel from a first image frame captured by a sensor, wherein each respective measurement from the first set of measurements is associated with a different signal phase; converting the first set of measurements using an analog to digital converter (ADC) to yield a first set of digitized measurements; and determining, based on the first set of digitized measurements, a first confidence map value that corresponds to the pixel from the first image frame, wherein the first confidence map value is indicative of at least one defect in the sensor.

15 Claims, 9 Drawing Sheets

700

Obtain A First Set Of Measurements Corresponding To A Pixel From A First Image Frame Captured By A Time-Of-Flight (ToF) Sensor, Wherein Each Respective Measurement From The First Set Of Measurements Is Associated With A Different Signal Phase
702

Convert The First Set Of Measurements Using An Analog To Digital Converter (ADC) To Yield A First Set Of Digitized Measurements
704

Determine, Based On The First Set Of Digitized Measurements, A First Confidence Map Value That Corresponds To The Pixel From The First Image Frame, Wherein The First Confidence Map Value Is Indicative Of At Least One Defect In The ToF Sensor
706

FIG. 7

DETECTING SENSOR DEFECTS FOR THREE-DIMENSIONAL TIME-OF-FLIGHT SENSORS

BACKGROUND

1. Technical Field

The present disclosure generally relates to identifying whether hardware used to receive or process signals is generating errors. More specifically, the present disclosure is related to detecting defects within three-dimensional time-of-flight sensors.

2. Introduction

An autonomous vehicle is a motorized vehicle that can navigate without a human driver. An exemplary autonomous vehicle (AV) control system can include various sensors, such as a camera sensor, a light detection and ranging (LIDAR) sensor, and a radio detection and ranging (RADAR) sensor, amongst other sensors. The sensors collect data and measurements that the autonomous vehicle can use for operations such as navigation. The sensors can provide the data and measurements to an internal computing system of the autonomous vehicle, which can use the data and measurements to control a mechanical system of the autonomous vehicle, such as a vehicle propulsion system, a braking system, or a steering system. Typically, the sensors are mounted at fixed locations on the autonomous vehicles.

BRIEF DESCRIPTION OF THE DRAWINGS

The various advantages and features of the present technology will become apparent by reference to specific implementations illustrated in the appended drawings. A person of ordinary skill in the art will understand that these drawings only show some examples of the present technology and would not limit the scope of the present technology to these examples. Furthermore, the skilled artisan will appreciate the principles of the present technology as described and explained with additional specificity and detail through the use of the accompanying drawings in which:

FIG. 7 is a flowchart that illustrates an example process that may be used to identify faults within an imaging device, according to some aspects of the disclosed technology;

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form to avoid obscuring the concepts of the subject technology.

Some aspects of the present technology may relate to the gathering and use of data available from various sources to improve safety, quality, and experience. The present disclosure contemplates that in some instances, this gathered data may include personal information. The present disclosure contemplates that the entities involved with such personal information respect and value privacy policies and practices.

Described herein are systems, apparatuses, processes (also referred to as methods), and computer-readable media (collectively referred to as "systems and techniques") for evaluating whether components of a sensing device (e.g., Time-of-Flight camera) are functioning properly. Techniques of the present disclosure may perform calculations using sensed data to identify whether specific components (analog or digital) of a sensing device have failed. These techniques may include collecting samples of a light signal (e.g., differential correlation samples) and converting the sampled values to a digital measurement (e.g., using an analog-to-digital converter) in order to determine one or more metrics indicative of faults or errors. In instances when the sampled values do not correspond to expectations, a component of the sensing device may have failed. Furthermore, the results of specific calculations may map to specific types of hardware component failures.

Figure 1:
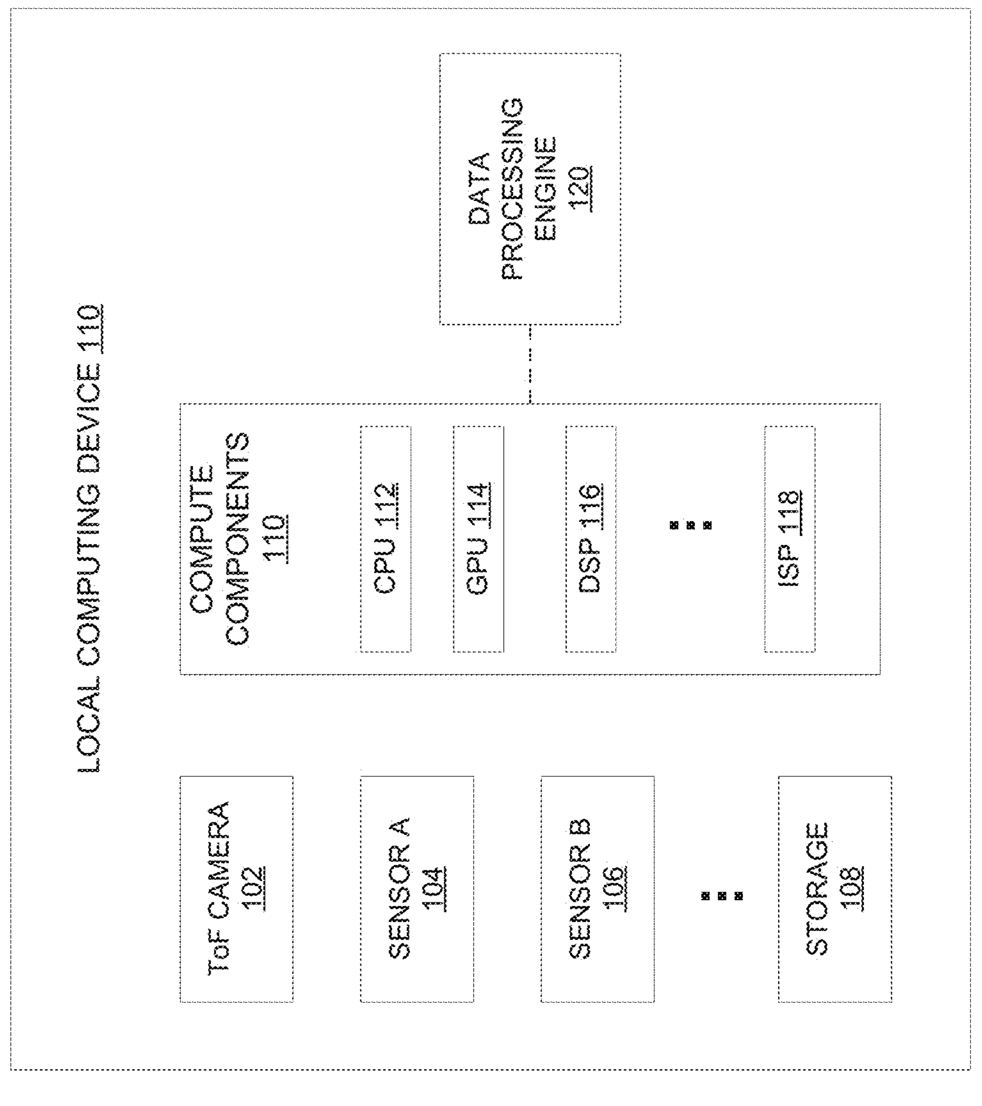
FIG. 1 is a block diagram illustrating an example of an electronic device used to capture sensor data, according to some aspects of the disclosed technology.

FIG. 1 is a diagram illustrating an example of an electronic device used to capture sensor data. In some aspects, the electronic device illustrated in FIG. 1 can include or represent the local computing device 810 shown in FIG. 8. However, in other examples, the electronic device can include or represent any other device used to capture and process sensor data as further described herein.

In some examples, local computing device 110 can be configured to perform 3D image signal processing. In some aspects, local computing device 110 can be configured to provide one or more functionalities such as, for example, imaging functionalities, image processing functionalities, 3D image filtering functionalities, image data segmentation functionalities, depth estimation functionalities, phase unwrapping functionalities, AV perception detection functionalities (e.g., object detection, pose detection, face detection, shape detection, scene detection, etc.), extended reality (XR) functionalities (e.g., localization/tracking, detection, classification, mapping, content rendering, etc.), device management and/or control functionalities, autonomous driving functionalities, computer vision, robotic functions, automation, and/or any other computing functionalities.

Figure 8:
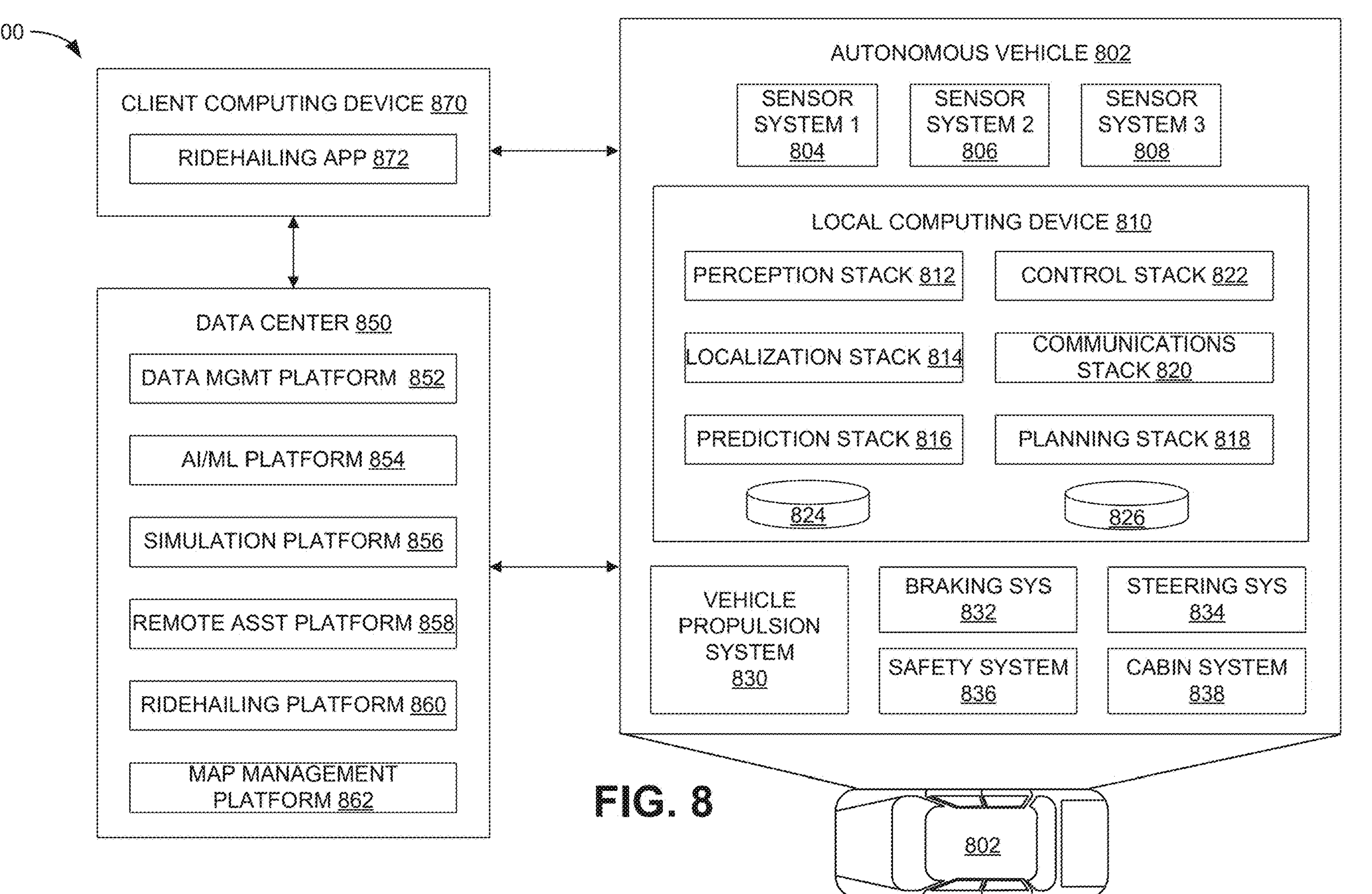
FIG. 8 illustrates an example system environment that can be used to facilitate autonomous vehicle (AV) dispatch and operations, according to some aspects of the disclosed technology.

In the illustrative example shown in FIG. 1, local computing device 110 can include a Time-of-Flight (ToF) camera 102 (also referred to as ToF sensor) and one or more sensors such as sensor A 104 and sensor B 106 (similar to sensor systems 804-808 as illustrated in FIG. 8). In some examples, ToF camera 102 can be a 3D ToF camera system, which is configured to create a 3D image of a scene or object (e.g., 3D point cloud or depth map). Non-limiting examples of the one or more sensors (e.g., sensor A 104 and/or sensor B 106) can include a camera, an ultrasonic sensor, an IMU, a depth sensor using any suitable technology for determining depth (e.g., based on ToF, structured light, or other depth sensing technique or system), a touch sensor, a LiDAR sensor, a RADAR sensor, a microphone, etc.).

In some examples, ToF camera 102 and/or one or more sensors (e.g., sensor A 104 or sensor B 106) can capture image data and generate frames based on the image data and/or provide the image data or frames to one or more compute components 110 for processing. A frame can include a video frame of a video sequence or a still image. A frame can include a pixel array representing a scene. For example, a frame can be a red-green-blue (RGB) frame having red, green, and blue color components per pixel; a luma, chroma-red, chroma-blue (YCbCr) frame having a luma component and two chroma (color) components (chroma-red and chroma-blue) per pixel; or any other suitable type of color or monochrome picture.

In the illustrative example of FIG. 1, local computing device 110 can include storage 108, which comprises any storage device(s) for storing data such as, for example and without limitation, image data, posture data, scene data, user data, preferences, etc. In some examples, storage 108 can store data from any of the components of local computing device 110. For example, storage 108 can store data or measurements from any of ToF camera 102, one or more sensors (e.g., sensor A 104, sensor B 106, etc.), compute components 110 (e.g., processing parameters, outputs, video, images, segmentation maps/masks, depth maps, filtering results, confidence maps, masks, calculation results, detection results, etc.), data processing engine 120, and/or any other components. In some examples, storage 108 can include a buffer for storing data (e.g., image data, posture data, etc.) for processing by compute components 110.

In some cases, local computing device 110 can include one or more compute components 110 such as a central processing unit (CPU) 112, a graphics processing unit (GPU) 114, a digital signal processor (DSP) 116, an image signal processor (ISP) 118, etc. In some aspects, local computing device 110 can use one or more compute components 110 to perform various computing operations such as, for example, image processing functionalities, precision predictions of image data as described herein, autonomous driving operations, extended reality operations (e.g., tracking, localization, object detection, classification, pose estimation, mapping, content anchoring, content rendering, etc.), detection (e.g., face detection, object detection, scene detection, human detection, etc.), image segmentation, device control operations, image/video processing, graphics rendering, machine learning, data processing, modeling, calculations, computer vision, and/or any other operations.

In some cases, one or more compute components 110 can perform image/video processing, machine learning, depth estimation, XR processing, device management/control, detection (e.g., object detection, face detection, scene detection, human detection, etc.) and/or other operations as described herein using data from ToF camera 102, one or more sensors (e.g., sensor A 104, sensor B 106, etc.), storage 108, and/or any other sensors and/or components. In some examples, one or more compute components 110 can implement one or more software engines and/or algorithms such as, for example, data processing engine 120 or algorithm as described herein. In some cases, one or more compute components 110 can implement one or more other or additional components and/or algorithms such as a machine learning model(s), a computer vision algorithm(s), a neural network(s), and/or any other algorithm and/or component.

In some aspects, data processing engine 120 can implement one or more algorithms and/or machine learning models configured to generate depth estimates, generate depth standard deviation, perform image processing, etc., as further described herein.

In some aspects, local computing device 110 can be part of, or implemented by, a single computing device or multiple computing devices. In some examples, local computing device 110 can be part of and/or include an electronic device (or devices) such as a computer system (e.g., a server, a laptop computer, a tablet computer, etc.), a camera system (e.g., a digital camera, an IP camera, a video camera, a security camera, etc.), a telephone system (e.g., a smartphone, a cellular telephone, a conferencing system, etc.), a display device, an XR device such as a head-mounted display (HMD), an IoT (Internet-of-Things) device, or any other suitable electronic device(s).

Further, the components shown in FIG. 1 with respect to local computing device 110 are illustrative examples provided for explanation purposes. In other examples, local computing device 110 can include more or less components than those shown in FIG. 1. While local computing device 110 is shown to include certain components, one of ordinary skill will appreciate that local computing device 110 can include more or fewer components than those shown in FIG. 1. For example, local computing device 110 can include, in some instances, one or more memory devices (e.g., RAM, ROM, cache, and/or the like), one or more networking interfaces (e.g., wired and/or wireless communications interfaces and the like), one or more display devices, caches, storage devices, and/or other hardware or processing devices that are not shown in FIG. 1. An illustrative example of a computing device and/or hardware components that can be implemented with local computing device 110 are described below with respect to FIG. 9.

Figure 2:
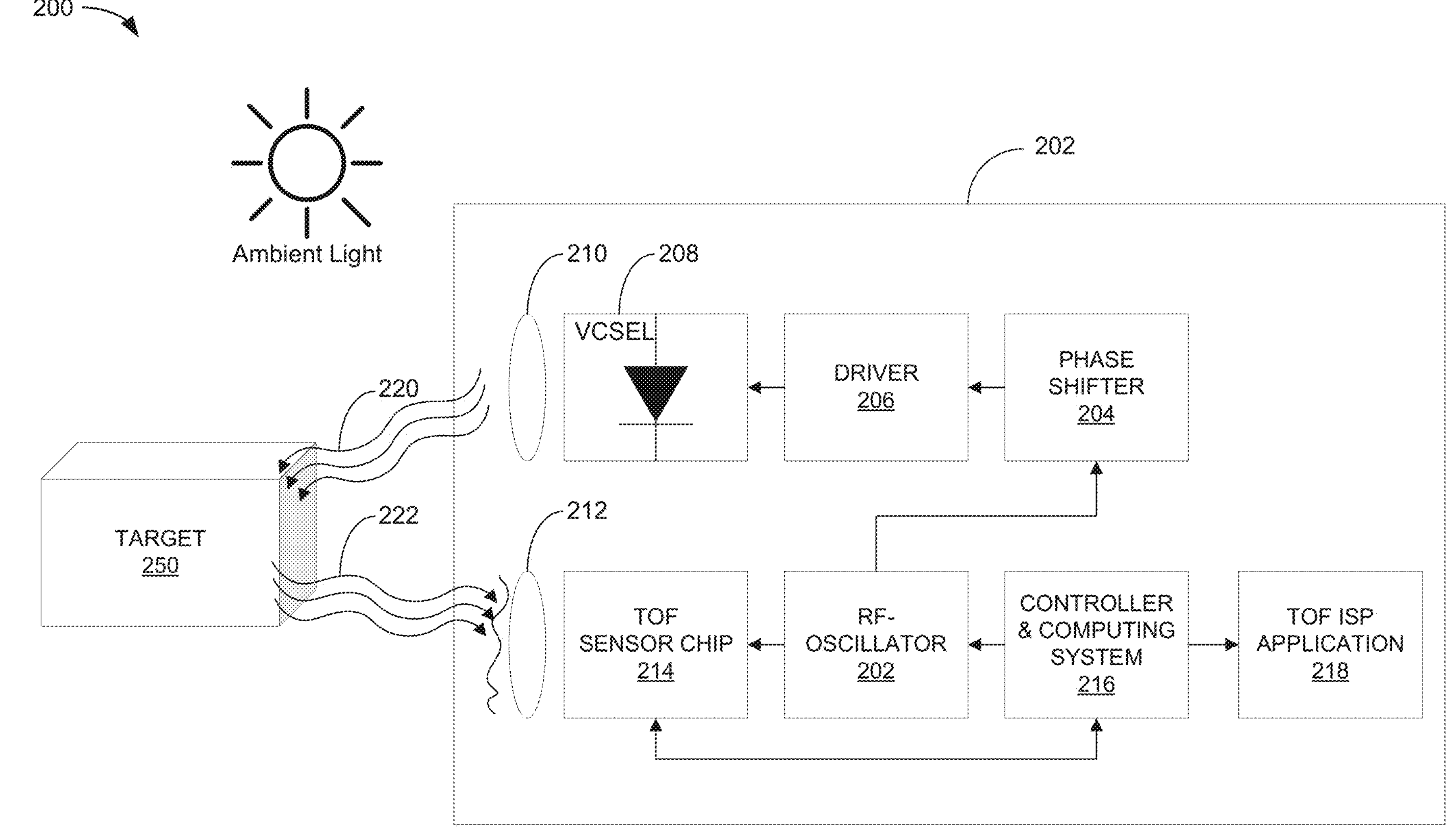
FIG. 2 is a block diagram illustrating an example imaging environment with a Time-of-Flight (ToF) camera system, according to some aspects of the disclosed technology.

FIG. 2 illustrates an example imaging environment 200 with a three-dimensional (3D) camera system. In this example, the 3D camera system is ToF camera 102 (also referred to as a ToF sensor or ToF camera sensor) described above with respect to FIG. 1. In some examples, ToF camera 102 can be used to implement the systems and techniques described herein. For example, ToF camera 102 can include a range imaging camera system that resolves distance based on the speed of light, a measured time-of-flight of a light signal between the camera and target in the scene for each point of a captured frame.

As explained previously, ToF camera 102 can work by illuminating a scene with a transmitted light 220 (e.g., transmitted signal, modulated output/signal, incident light, or emitted light/signal) and observing (e.g., receiving, capturing or recording, sensing, measuring, analyzing, etc.) a received light 222 (e.g., received signal, backscattered light/signal, or reflected signal/light) that is backscattered (e.g., reflected) by target 250. In the illustrative example of FIG. 2, ToF camera 102 can include a local oscillator clock 202 (e.g., radio frequency (RF) oscillator), a phase shifter 204 at a transmission channel, a driver 206, a light source 208, and a transmit optical system 210.

In some cases, local oscillator clock 202 can include any applicable type of oscillator clock, otherwise referred to as a radio frequency (RF)-oscillator clock. Local oscillator clock 202 can generate a clock signal that can be used to modulate an output signal of ToF camera 102 (e.g., transmitted light 220) and/or to demodulate the ToF pixels on the sensor array (ToF sensor chip 214). In some aspects, phase shifter 204 can receive the clock signal generated by local oscillator clock 202 and delay it for purposes of creating a phase adjusted input. While phase shifter 204 is shown as being implemented on the transmitting channel, in various examples, phase shifter 204 can be implemented in the receiving channel of ToF camera 102. For example, phase shifter 204 can be implemented in the receiving channel to affect modulation of the signal generated by light source 208. In another example, phase shifter 204 can be implemented between ToF sensor chip 214 and local oscillator clock 202 or directly integrated with the ToF sensor chip 214.

In some examples, driver 206 can receive the phase adjusted clock signal from phase shifter 204 and modulate the signal based on the phase adjusted clock signal to generate modulated output (e.g., transmitted light 220) from light source 208. In some examples, the illumination of ToF camera 102 can be generated by light source 208. Light source 208 can include, for example and without limitation, a solid-state laser (e.g., a laser diode (LD), a vertical-cavity surface-emitting laser (VCSEL), etc.), a light-emitting diode (LED), etc.), a lamp, and/or any other light emitter or light emitting device.

In some aspects, transmitted light 220 (e.g., modulated output from light source 208) can pass through transmit optical system 210 and be transmitted towards a target 250 in a scene. In some cases, target 250 can include any type of target, surface, interface, and/or object such as, for example and without limitation, a human, an animal, a vehicle, a tree, a structure (e.g., a building, a wall, a shelter such as a bus stop shelter, etc.), an object, a surface, a device, a material with a refractive index that allows at least some light (e.g., transmitted light 220, ambient light, etc.) to be reflected/backscattered from the material, and/or any other target, surface, interface, and/or object in a scene.

In the illustrative example of FIG. 2, ToF camera 102 includes a receiving optical system 212, a ToF sensor chip 214, and a controller and computing system 216 supporting an application 218. In the example environment 200, when transmitted light 220 (e.g., an RF modulated infrared (IR) optical signal with an equal wave front) interacts with target 250, at least some of transmitted light 220 can be reflected back towards ToF camera 102 as a received light 222 (e.g., backscattered signal, light incident on ToF camera 102, etc.).

In some examples, received light 222 passes through receiving optical system 212 to ToF sensor chip 214. In some cases, received light 222 can include the RF modulated IR optical signal backscattered with different time-of-flight delays. The different ToF delays in received light 222 can represent, or otherwise encode, 3D information of target 250. As used herein, 3D information of a target can include applicable information defining characteristics of a target in 3D space. For example, 3D information of a target can include range information that describes a distance between a reference and the target or a portion of the target.

In some examples, the light that is received by and/or enters (e.g., the light incident on) receiving optical system 212 and/or ToF sensor chip 214 can include a reflected component. In other examples, the light that is received by and/or enters (e.g., the light incident on) enters the receiving optical system 212 and/or ToF sensor chip 214 can include a reflected component as well as an ambient component. In some examples, the distance (e.g., depth) information may be embedded in, measured from, and/or defined by the reflected component or may only be embedded in the reflected component. As such, a certain amount of (and/or any amount of) an ambient component can reduce the signal-to-noise ratio (SNR).

In some examples, ToF depth image processing methods can include collecting correlation samples (CSs) to calculate a phase estimate. For example, correlation samples of a ToF pixel and/or image can be collected at one or more time points, such as sequential time points, and at different phase shift/offset conditions. The signal strength of the correlation samples varies with the different phase shifts. As such, these samples output from the ToF pixel and/or image have different values.

In some cases, ToF sensor chip 214 can detect varying ToF delays in received light 222. As follows, ToF sensor chip 214 can communicate with controller and computing system 216 to process the ToF delays and generate 3D information based on the ToF delays.

In some aspects, controller and computing system 216 support application 218 that performs further signal processing and controls various functional aspects, for example, based on the 3D information. For example, application 218 can control or facilitate control of an AV (e.g., AV 802 as illustrated in FIG. 8) based on the 3D information.

As explained, the light from a modulated light source (e.g., transmitted light 220) is backscattered by target 250 in the field of view of ToF camera 102, and the phase shift between transmitted light 220 and received light 222 can be measured. By measuring the phase shift at multiple modulation frequencies, a depth value for each pixel can be calculated. In one illustrative example, based on a continuous-wave (CW) method, ToF camera 102 can take multiple samples per measurement, e.g., with each sample phase-stepped by, e.g., 90 degrees, for a total of four samples (however, the present technology is not limited to 4 phased-stepped implementation). Using this technique, ToF camera 102 can calculate the phase angle between illumination and reflection and the distance associated with target 250. In some cases, a reflected amplitude (A) and an offset (B) can have an impact on the depth measurement precision or accuracy. Moreover, ToF camera 102 can approximate the depth measurement variance. In some cases, the reflected amplitude (A) can be a function of the optical power, and the offset (B) can be a function of the ambient light and residual system offset.

When received light 222 arrives at a ToF sensor of ToF camera 102 (e.g., through a lens of ToF camera 102), each pixel of the ToF sensor demodulates the RF-modulated light 222 generated by electrons and concurrently integrates the photogenerated charges in pixel capacitors at multiple phase shift steps or phase offsets at multiple phase windows. In this way, ToF camera 102 can acquire a set of raw ToF data. ToF camera 102 can then process the raw ToF data. For example, ToF camera 102 can demodulate the time-of-flight and use the time-of-flight to calculate the distance from ToF camera 102 to target 250. In some cases, ToF camera 102 can also generate an amplitude image of active light (A) and a grayscale image of passive light or offset part (B) of the active light.

In some examples, the distance demodulation can establish the basis for estimating depth by ToF camera 102. In some cases, there can be multiple capacitors and multiple integral windows with a phase difference π under each pixel of the ToF sensor of ToF camera 102. In one sampling period, the pixel can be designed with electronics and capacitors that can process and accumulate the differential charge or samples. This process is called differential correlation sampling (DCS) and may be used as a method to cancel or minimize the offset (B) from the correlation results. In an example implementation of a 4-DCS method, the capacitors can sample a signal four times at four phases such as 0°, 90°, 180° and 270° phases. ToF camera 102 can use the sample results (e.g., DCS1, DCS2, DCS3, DCS4 sampled at different phase shifts between transmitted light 220 and received light 222 to calculate the distance of target 250 (relative to the ToF camera 102) based on the phase shift.

Equation (1) below provides an example for calculating DCS (e.g., under approximately ideal conditions), in which $DCS_k$ corresponds to the signal used for distance evaluation for k=0, 1, 2, 3; A corresponds to the ToF amplitude; $\varphi_d$ corresponds to the phase of the signal; and $\psi_k$ corresponds to the phase of f sets (e.g., 0°, 90°, 180° and 270°).

$$DCS_k = A\cdot\cos(\varphi_d - \psi_k);\ k = 0, 1, 2, 3 \tag{1}$$

In some examples, ToF camera 102 can measure a distance for every pixel to generate a depth map. In some cases, a depth map can include a collection of 3D points (e.g., each point is also known as a voxel). In some cases, the depth map can be rendered in a two-dimensional (2D) representation or image. In other cases, a depth map can be rendered in a 3D space as a collection of points or point cloud. In some examples, the 3D points can be mathematically connected to form a mesh onto which a texture surface can be mapped.

Figure 3:
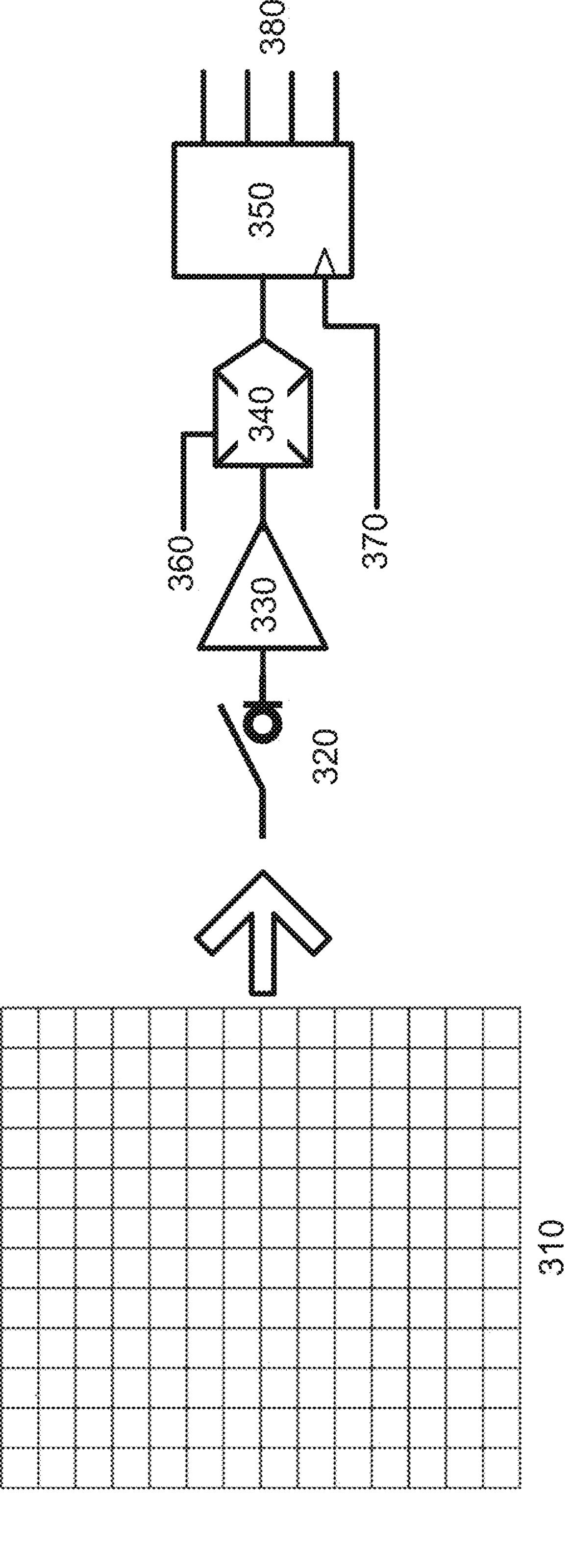
FIG. 3 illustrates an example subsystem 300 of a ToF camera, according to some aspects of the disclosed technology.

FIG. 3 illustrates an example subsystem 300 of a ToF sensor such as ToF camera 102. In some aspects, subsystem 300 can include an array of sensing elements or pixels such as sensing array 310. In some cases, each respective sensing element (e.g., pixel) may be coupled to one or more circuits that can convert values of light signal amplitude to a discrete value represented as a series of binary bits. In some instances, each of the different pixels included in sensing array 310 may be arranged in a column/row format. In some aspects, each pixel may be coupled to switches (e.g., transistors, multiplexors, etc.) that allow each respective pixel to be connected to circuits that convert an analog voltage to digital values represented by a set of digital bits. In some configurations, the pixels may be arranged in a column and row fashion such that switches may controllably connect each respective pixel to an analog to digital converter (ADC) such as ADC 350.

For instance, a set of switches 320 may be used to connect individual pixels from array 310 to amplifier 330. In some configurations, the gain of the amplifier 330 can be greater than 1 while in other configurations the gain can be approximately equal to 1 (e.g., amplifier 330 can be configured as a buffer). In some aspects, amplifier 330 may amplify a voltage present on a selected pixel. An output of amplifier 330 may be connected to an input of multiplexer 340. An output of multiplexer 340 may provide a selected signal to ADC 350. That is, one or more switches (e.g., switched 320) and/or one or more multiplexers (e.g., multiplexer 340) may be used to route a signal from one or more pixels of array 310 to ADC 350.

In some cases, a selection signal 360 may be used to select an input of multiplexer 340 to provide an amplified signal to ADC 350. In some examples, an activation line 370 may trigger ADC 350 to convert an input provided by multiplexer 340 to a digitized value that can be output by ADC 350. In some configurations, ADC 350 may controllably output sets of bits that represent digital (e.g., binary) values of sampled voltages. In some cases, these binary values or data output by ADC 350 may be provided to a processor that generates images from these values.

In some instances, ADC 350 may select-ably convert signals for one or more pixels from array 310 (e.g., ADC may convert an entire column of array 310 and/or an entire row of array 310). In some aspects, a failure of ADC 350 may result in erroneous digitized values for the light measured by one or more pixels. For instance, a fault by ADC 350 may yield the same digitized value for conversions corresponding to different differential correlation samples (DCS).

Although the number ADCs used in a design may vary, a fault or failure of a single ADC may have an effect on digital values that a processor receives. In some cases, certain types of faults or failures may be identified based on a pattern of data that is received from a set of circuits. For example, an ADC that apparently provides the same value to the processor may be classified as having the stuck value ADC failure. A pattern of received data from a set of circuits may, therefore, be characteristic of a type of failure or defect in an ADC or in other circuits.

Examples of ADC stuck value failures can include an ADC outputting one value or a range of values (e.g., 0, 2047, −2048, or any other value (X)). For instance, a stuck value failure may mean that whenever the ADC activation line 370 is active, that ADC outputs 380 always provide the same binary value and/or the same range of binary values (e.g., one or more of outputs 380 is stuck at a '0' value or a '1' value). Another type of failure that may be encountered in an ADC are intermittent failures. For example, an ADC may fail to properly convert the input signal and may intermittently output an erroneous value.

Systems and techniques of the present disclosure may identify faults or errors with ADC 350 and/or other components of ToF camera 102 by capturing outputs 380 and determining one or more operators/discriminators that can be associated with a confidence map. In some cases, the outputs 380 may correspond to measurements at different phases (e.g., differential correlation signals). In some aspects, the outputs 380 may correspond to a measurement taken from a grayscale image. When ADC 350 is operating properly, the different phase delay conditions should, under typical circumstances, cause the ADC 350 to output different values. By comparing values output from the ADC 350, one or more faults or failures can be identified because values output by the ADC should change because of the phase delay associated with the differential correlation signal.

Figure 4:
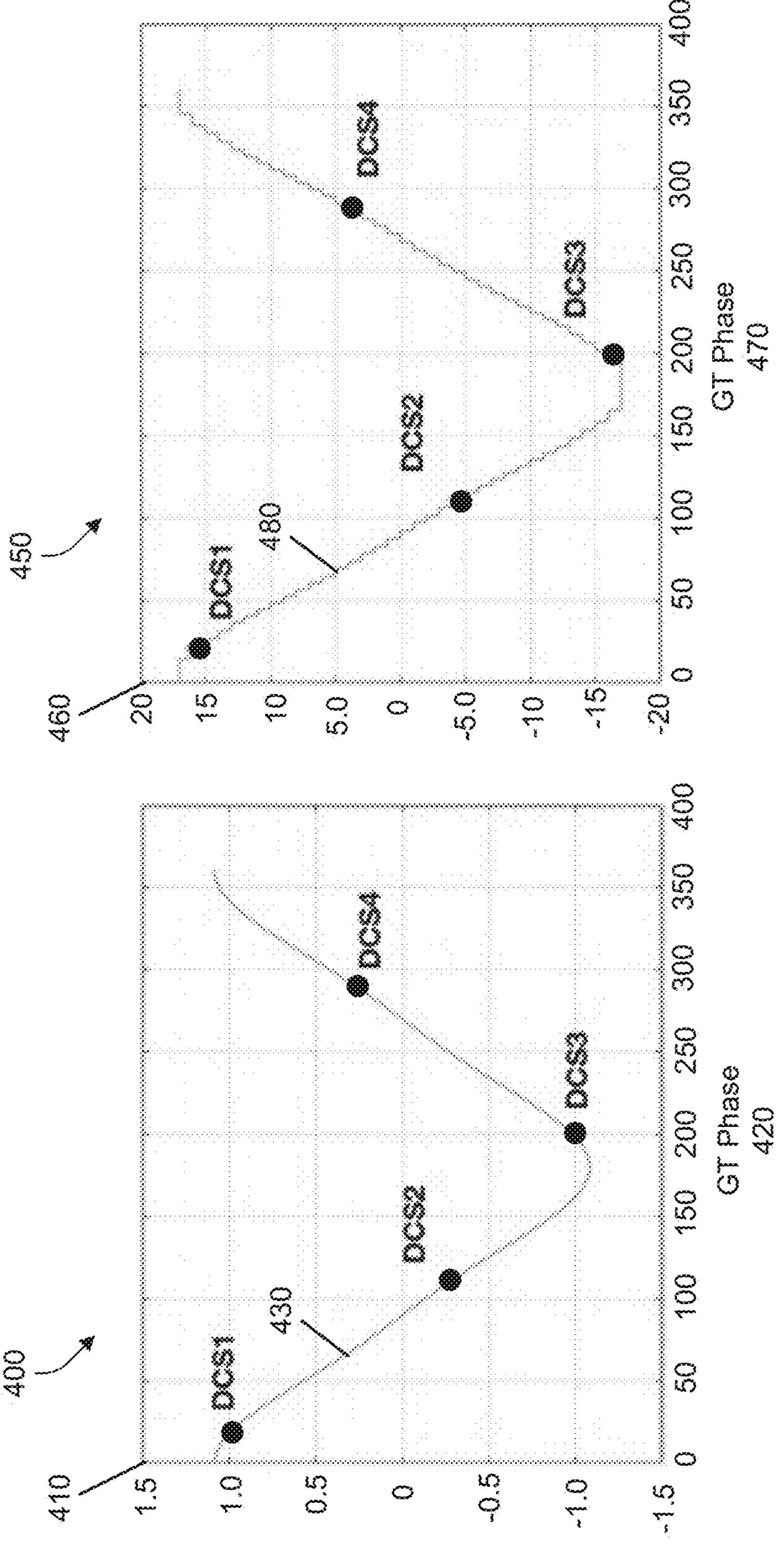
FIG. 4 is a graphical representation of a signal received by a pixel that is sampled using differential correlation sampling (DCS), according to some aspects of the disclosed technology.

FIG. 4 illustrates a plot 400 of signal 430 that may be received by pixel. FIG. 4 also includes plot 450 of a digitized signal 480 which may correspond to the output of an ADC that samples signal 430. For visualization, plot 450 is based on a 5-bit ADC although other ADC configurations are contemplated by the present technology. As illustrated, plot 400 includes a graph with vertical axis 410 and horizontal axis 420. The vertical axis 410 has a scale that ranges from minus 1.5 volts to 1.5 volts and horizontal axis 420 has a scale that ranges from 0 degrees phase shift to 360 degrees phase shift. Once an analog voltage value is converted to a set of binary bits, analog value may be represented by binary values. As such, the vertical axis 460 of plot 450 corresponds to binary values and the horizontal axis 470 of plot 450 also has a scale that ranges from 0 degrees phase shift to 360 degrees phase shift.

Each of the two plots (e.g., plot 400 and plot 450) include indicators of correlation samples that may be used to determine whether image sensing circuits and/or related ADCs are functioning properly. Locations associated with these correlation samples are marked as points DCS1, DCS2, DCS3, and DCS4, where the abbreviation "DCS" represents "differential correlation sample." Analog detection circuits of an imaging device (e.g., a LIDAR or TOF device) may include circuits that shift phase of signals received by a pixel. In operation, the phase of received signals may be swept continuously. Circuits or components such as those discussed in respect to FIG. 2 and/or FIG. 3 may allow an ADC to receive and sample signal 430 at points DCS1, DCS2, DCS3, and DCS4. Binary values may be generated by the ADC at points DCS1, DCS2, DCS3, and DCS4 and these values may be organized into sets of DCS data.

In certain instances, light signals transmitted from a sensing device may be transmitted at varying phases (e.g., with a swept phase Sine wave). In some examples, a transmitted waveform may be associated with DCS points, where each of the points (DCS 1, DCS 2, DCS 3, and DCS4) are offset by 90 degrees. For example, DCS 1 can be offset from DCS 3 by 180 degrees and DCS 2 and DCS 4 can be offset by 180 degrees. In some aspects, the waveform (e.g., a Sine wave) may repeat itself every 360 degrees around a center point (e.g., a zero value) and a balanced DCS signal may be identified by adding a value of point DCS 1 with a value of DCS 3. Similarly, this balanced DCS signal may be identified by adding a value of point DCS 1 with a value of point DCS 4. In some aspects, the corresponding samples may have a sum that is approximately zero (e.g., DCS 1+DCS 3 and DCS 2+DCS 4 may be equal to zero). In some cases, a signal having samples that do not yield expected results (e.g., an unbalanced signal) may be indicative of one or more faults or failures within the ToF sensor.

That is, evaluations may be performed using these DCS data to identify whether circuits, components, pixels, and/or any other aspect of an image sensor is functioning properly. In some cases, faults may be identified by performing calculations using acquired DCS values. In some aspects, calculations may be performed using one or more different equations or sets of equations. In some examples, different equations or sets of equations may be tailored to identify a specific type of defect.

Table 1 (below) cross-references text that identifies a type of algorithm with a condition and a type of failure that the algorithm is tailored to identify. Table 1 shows that one or more algorithms or formulas CM/OP 5.0 may be used to detect a condition. For example, when all DCS values of a dataset equal a zero value, this may indicate that an ADC has failed with a stuck at zero failure. Similarly, the other algorithms CM/OP 5.1, CM/OP 5.2, CM/OP 5.3, CM/OP 5.4, and CM/OP 5.5 may be tailored to detect other failures or faults. The hardware failures and faults of table 1 include: ADC stuck at a 2047 failure, ADC stuck at an X failure, ADC or sensor circuit intermittent fault, and ADC is stuck at a value of −2048 failure. In Table 1, GS corresponds to a grayscale measurement.

TABLE 1

Defect Detection Algorithm & Condition vs Failure Type

| Defect Detection Algorithm | Condition | Failure Type |
|---|---|---|
| CM/OP 5.0 | DCS1 & DCS2 & DCS3 & DCS4 = 0 | ADC Defect (e.g., stuck at '0'_ |
| CM/OP 5.1 | DCS1 & DCS2 & DCS3 & DCS4 = Saturation | ADC Defect (e.g., stuck at saturation value) |
| CM/OP 5.2 | DCS1 & DCS2 & DCS3 & DCS4 = X | ADC Defect (stuck at value 'X') |
| CM/OP 5.3 | DCS1 & DCS2 & DCS3 & DCS4 & GS = X | ADC Defect (stuck at value 'X') |
| CM/OP 5.4 | DCS1 or DCS2 or DCS3 or DCS4 = −2048 (e.g., only 1 DCS = −2048) | Intermittent ADC Defect or Sensor Error |
| CM/OP 5.5 | DCS1 & DCS2 & DCS3 & DCS4 = −2048 | ADC Bits Stuck at −2048 |

In some aspects, a controller (e.g., controller 216) within a sensor may implement one or more algorithms that may be used to detect failures, faults, and/or defects. In some examples, each of these different algorithms may be referred to as a formula, equation, or operation. A set of calculations may be performed to identify a failure condition and/or type of fault. This may include performing a first calculation using acquired data and may include performing a second calculation using the results of the first calculation. In some aspects, the algorithms can be used to determine a confidence map and/or one or more operators/discriminators that can be used to identify a fault or defect.

In each of the following equations, OP refers to an operator that can be used to determine a confidence map. In some aspects, an operator (OP) can be calculated for a particular pixel index (i,j) that can be used to determine a confidence map (CM) element at the corresponding pixel index. The term GS refers to a grayscale measurement at a given pixel index. In some examples, one or more operators and/or confidence maps can be used to identify one or more faults associated with an image sensor. In one illustrative example, OP 5.0 and CM 5.0 (Equation (2) and Equation (3), respectively) can be used to detect an ADC stuck at zero condition.

$$OP5.0(i,j) = \text{abs}(DCS0(i,j)) + \text{abs}(DCS1(i,j)) + \text{abs}(DCS2(i,j)) + \text{abs}(DCS3(i,j)) \tag{2}$$

$$CM5.0(i,j) = \frac{OP5.0(i,j)}{\varepsilon + OP5.0(i,j)} \tag{3}$$

In another example, OP 5.1 and CM 5.1 (Equation (4) and Equation (5), respectively) can be used to detect an ADC stuck at a saturation value (e.g., 2047). It is noted that Equation (4) includes an exemplary value (e.g., 2047) but may be modified for alternative hardware implementations using different ADC components.

$$OP5.1(i,j) = \text{abs}(DCS0(i,j) - 2047) + \text{abs}(DCS1(i,j) - 2047) + \text{abs}((DCS2(i,j) - 2047) + \text{abs}(DCS3(i,j) - 2047) \tag{4}$$

$$CM5.1(i,j) = \frac{OP5.1(i,j)}{\varepsilon + OP5.1(i,j)} \tag{5}$$

In another example, OP 5.2 and CM 5.2 (Equation (6) and Equation (7), respectively) can be used to detect an ADC stuck at X condition.

$$OP5.2(i,j)=\text{abs}(DCS0(i,j))-DCS2(i,j))+\text{abs}(DCS1(i,j))-DCS3(i,j))+\text{abs}(DCS2(i,j)-DCS3(i,j)) \tag{6}$$

$$CM5.2(i,j)=\frac{OP5.2(i,j)}{\varepsilon+OP5.2(i,j)} \tag{7}$$

In another example, OP 5.3 and CM 5.3 (Equation (8) and Equation (9), respectively) can be used to detect an ADC stuck at X condition with gray scale enhancement.

$$OP5.3(i,j)=OP5.2(i,j)+\text{abs}(DCS0(i,j)-\text{abs}(GS(i,j))) \tag{8}$$

$$CM5.3(i,j)=\frac{OP5.3(i,j)}{\varepsilon+OP5.3(i,j)} \tag{9}$$

In another example, OP 5.4 and CM 5.4 (Equation (10) and Equation (11), respectively) can be used to detect an ADC or sensor error stuck at an intermittent condition. It is noted that Equation (10) includes an exemplary value (e.g., 2048) but may be modified for alternative hardware implementations using different ADC components.

$$OP5.4(i,j)=(DCS0(i,j)+2048)*(DCS1(i,j)+2048)*(DCS2(i,j)+2048)*(DCS3(i,j)+2048) \tag{10}$$

$$CM5.4(i,j)=\frac{OP5.4(i,j)}{\varepsilon+OP5.4(i,j)} \tag{11}$$

In another example, OP 5.5 and CM 5.5 (Equation (12) and Equation (13), respectively) can be used to detect an ADC stuck at −2048 condition. It is noted that Equation (12) includes an exemplary value (e.g., 2048) but may be modified for alternative hardware implementations using different ADC components.

$$OP5.5(i,j)=\text{abs}(DCS0(i,j)+2048)+\text{abs}(DCS1(i,j)+2048)+\text{abs}(DCS2(i,j)+2048)+\text{abs}(DCS3(i,j)+2048) \tag{12}$$

$$CM5.5(i,j)=\frac{OP5.5(i,j)}{\varepsilon+OP5.5(i,j)} \tag{13}$$

One or more of the foregoing equations include operations of addition and/or subtraction using different sets of DCS values. It is noted that the term "abs" refers to taking the absolute value of a quantity. It is also noted that all DCS values that may be acquired may not necessarily be used in an evaluation and/or a different number of DCS values may be used (e.g., present technology is not limited to using 4 DCS measurements). These calculations may be performed using hardware (e.g., discrete logic, application specific integrated circuits-ASIC, and/or field programmable gate arrays-FPGA), firmware, graphical processing units (GPUs), or combinations thereof using resources that are part of a sensing system, such as a ToF sensor.

Equations that calculate values of CM 5.0, CM 5.1, CM 5.2, CM 5.3. CM 5.4, and CM 5.5 are similar to each other as each produces values that include a quantity (e.g., a value derived by performing equation OP 5.1) divided by a sum of that quantity plus a factor epsilon $\in$. In certain instances, epsilon may have a value of any selected small number. For example, in some cases, epsilon may have a value of 0.000001. As such the CM equations may yield values of approximately zero or one from which a determination may be made as to whether a particular failure condition exists. When techniques of the present disclosure are implemented at a sensing device, circuits of the sensing device may continue performing their primary function of collecting data while sensing hardware of the sensing device is tested for failures. As such, methods of the present disclosure may help identify that a sensing device of an AV should be repaired before a failure could contribute to degraded performance. By using data collected by a sensing device, test functions of the present disclosure may be performed without involving a computer that controls operation of an AV.

In some aspects, the present technology can be used to identify additional faults or failures and/or to evaluate sensor performance. For instance, one or more algorithms that evaluate sensor performance may identify failures associated with the analog and/or digital components of a sensing device like the sensing array 310, switches 320, amplifier 330, multiplexer 340, and/or ADC 350 of FIG. 3. In one illustrative example, a general performance equation may be formulated according to Equation (14), as follows:

$$CM6_{baseline}=\frac{\text{Signal}-UnbalancedSignal}{\varepsilon+\text{Signal}+UnbalancedSignal} \tag{14}$$

In some aspects, the above confidence map equation can be extended to include one or more terms from Equations (2)-(13) above, which may be noted as follows:

$$CM6S_{extension}=(CM6_{baseline}+\delta)\times CM5S \tag{15}$$

Each of equations (14) and (15) may be used to make evaluations regarding the functioning of sensing circuits.

In one illustrative example, Equation (16) may identify values of OP 6.0 A as a function of pixel locations (i,j) representing the balanced signal, as follows:

$$OP6.0A(i,j)=\text{abs}(DCS0(i,j)-DCS2(i,j))+\text{abs}(DCS1(i,j)-DCS3(i,j)) \tag{16}$$

In another example, Equation (17) may be used to identify values of OP 6.0B as a function of pixel locations (i,j) representing the unbalanced signal, as follows:

$$OP6.0B(i,j)=C*\text{abs}(DCS0(i,j)+DCS1(i,j)+DCS2(i,j)+DCS3(i,j)) \tag{17}$$

It is noted that Equations (16) and (17) are used in the applied general performance Equation (18), as follows:

$$CM6.0(i,j)=\frac{OP6.0A(i,j)-OP6.0B(i,j)}{\varepsilon+OP6.0A(i,j)+OP6.0B(i,j)} \tag{18}$$

In some cases, values calculated by Equation (18) may vary between a value of −1 and a value of +1, where a value of −1 may indicate a sensor defect and a value of +1 may indicate that the sensor is operating with the best performance possible for the sensor. The factor C in Equation (17) may be a scaling factor, that may be assigned a value of one, for example.

Equations (19), (20), (21), (22), (23), and (24) listed below illustrate applications of extension equation (15). Equations used to calculate values for CM5S of extension equation (15) may be the same as the equations used to calculate values for CM 5.1, CM 5.2, CM 5.3, CM 5.4, and CM 5.5 as a function of pixel locations (i,j). That is, in some examples, Equations (19), (20), (21), (22), (23), and (24) can include factors that are associated with ADC related conditions and with signal and unbalanced signal values. In some aspects, Equations (19), (20), (21), (22), (23), and (24) may also generate values between −1 and 1, where a value of −1 may indicate a sensor failure, where a value of 0 may indicate that the ADC is stuck at a value (e.g., of 0, 2047, −2048, or X), and where a value of +1 indicates that the sensor is functioning at a highest performance level.

$$CM6.1(i,j)=[CM6.0(i,j)+\delta]\cdot CM5.0(i,j) \tag{19}$$

$$CM6.2(i,j)=[CM6.0(i,j)+\delta]\cdot CM5.1(i,j) \tag{20}$$

$$CM6.3(i,j)=[CM6.0(i,j)+\delta]\cdot CM5.5(i,j) \tag{21}$$

$$CM6.4(i,j)=[CM6.0(i,j)+\delta]\cdot CM5.2(i,j) \tag{22}$$

$$CM6.5(i,j)=[CM6.0(i,j)+\delta]\cdot [CM5.4(i,j)+(1-CM5.5(i,j))] \tag{23}$$

$$CM6.6(i,j)=[CM6.0(i,j)+\delta]\cdot CM5.4(i,j) \tag{24}$$

Table 2 (below) illustrates types of failures and faults that could be detected by applying the equations disclosed herein. As such, Table 2 cross-references algorithms that may be used to detect types of sensor or ADC related failure conditions and faults. Note that some of these failure conditions are related to the same type of ADC failures discussed in respect to Table 1 above. Other failures/faults in Table 2 include a signal that selects a pixel (a select signal failure), a demodulation failure, a sensor defect, and a defect in a column or row. Fault conditions in Table 2 include motion artifact faults, unflag errors, faults caused by an external interference (e.g., noise or glare), and a sensor that has a low (below threshold level) sensitivity. In one illustrative example, an unflag error may occur when the ADC is saturated (e.g., +2047 positive saturation or −2048 negative saturation for a 12-bit ADC) and the saturation circuitry does not respond as expected (e.g., expect +2047 but reports −2048).

TABLE 2

Analog/Digital Failure Cross-Reference

| Failure | CM 6.0 | CM 6.1 | CM 6.2 | CM 6.3 | CM 6.4 | CM 6.5 | CM 6.6 |
|---|---|---|---|---|---|---|---|
| Select Signal Failure | Y | Y | Y | Y | Y | Y | Y |
| D-mod Failure | Y | Y | Y | Y | Y | Y | Y |
| Sensor Defect | Y | Y | Y | Y | Y | Y | Y |
| Motion Artifact | Y | Y | Y | Y | Y | Y | Y |
| Strong External Interference Fault | Y | Y | Y | Y | Y | Y | Y |
| Column/Row Defect | Y | Y | Y | Y | Y | Y | Y |
| Low Sensitivity Sensor | Y | Y | Y | Y | Y | Y | Y |
| ADC 0 Stuck | N | Y | N | N | N | N | N |
| ADC 2047 Stuck | N | Y | Y | N | N | N | N |
| ADC −2048 Stuck Permanent | N | N | N | Y | N | N | N |
| ADC Stuck Any Value | N | N | N | N | Y | N | N |
| ADC −2048 Unflag | N | N | N | N | N | Y | N |
| ADC −2048 Unflag + Permanent Stuck | N | N | N | N | N | N | Y |

Figure 5:
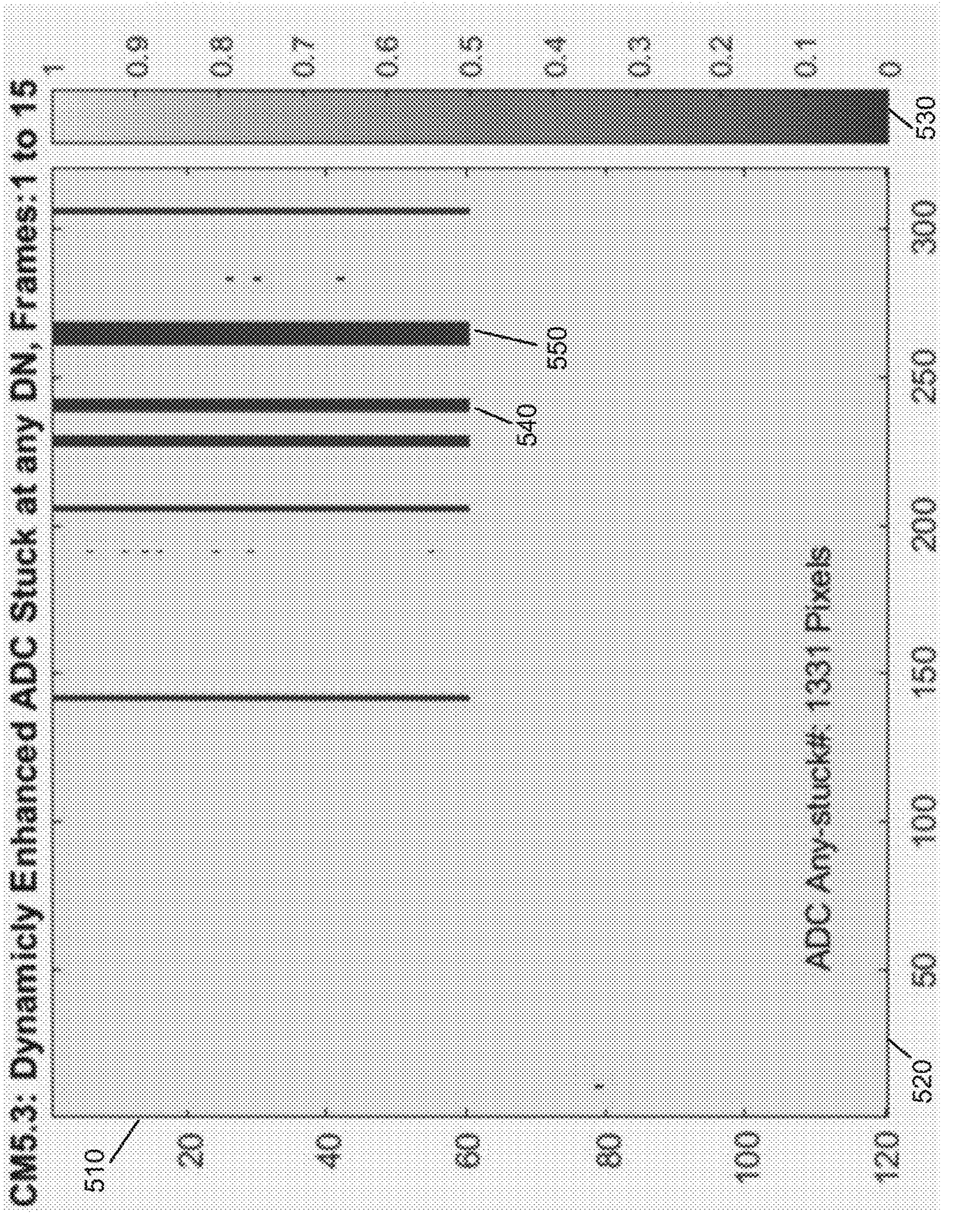
FIG. 5 illustrates an example of a confidence map, according to some aspects of the disclosed technology.

In some cases, failure or fault conditions detected by techniques of the present disclosure may be visible in a confidence map (CM). FIG. 5 illustrates an example of a confidence map 500 that may be generated using Equation (9) related to CM5.3 (as noted above). In some examples, confidence map 500 can include vertical axis 510 and a horizontal axis 520 that map an array of pixels in a column/row format.

In some cases, the confidence map 500 can be generated from data collected over several different acquisition frames (e.g., multiple frames such as frames 1 through 15). In some aspects, certain areas of the confidence map 500 can identify pixel locations that are associated with a fault or failure. For instance, area 540 and area 550 can correspond to pixel locations where results of equation CM 5.3 correspond to a value that is approximately 0 and is indicative of an ADC outputting some incorrect value (e.g., failure may be referred to as being an "any stuck" failure).

In some aspects, scale 530 can provide a gradient (e.g., varying color or pattern) that indicates the results of equation CM 5.3. For example, values near zero can be depicted with a darker color and lighter colors can be used to depict higher values of equation CM 5.3 (e.g., values near one). As such, confidence map 500 can show the locations of pixels that were associated with any bit of an ADC being stuck during acquisition frames 1 through 15.

Figure 6:
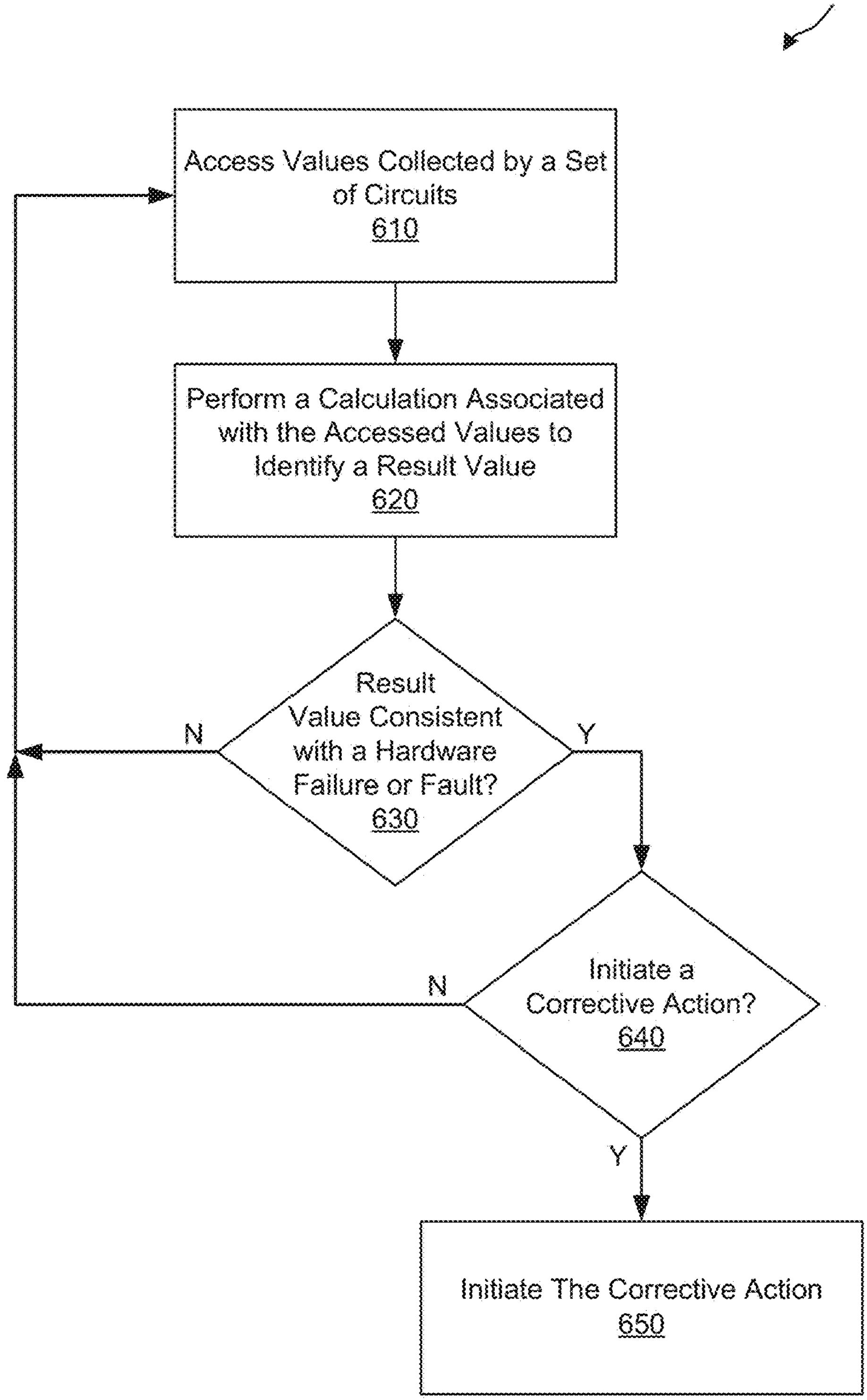
FIG. 6 is a flowchart that illustrates actions that may be performed to identify faulty operation of components of an imaging device, according to some aspects of the disclosed technology.

FIG. 6 is a flowchart 600 that illustrates actions that may be performed to identify faulty operation of components of an imaging device. At block 610, data values collected by a set of hardware circuits are accessed. In some cases, the data may be collected by a hardware circuit and/or a processor that performs calculations on this collected data. In some examples, calculations may be performed using dedicated hardware, by a processor executing instructions, or a combination of both. When hardware is used to perform calculations, a set of logic may perform mathematical operations at hardware speeds. When a processor is used, that processor may be a conventional processor or may be a GPU that executes firmware at a sensing device. As such, calculations may be performed at block 620 using any desired set of hardware. Determination block 630 may then identify whether a hardware fault condition or failure has been detected. When determination block 630 identifies that a hardware fault condition or failure has not been detected, additional values may be accessed at block 610.

When determination block 630 identifies that the hardware fault or failure has been detected, determination block 640 may identify whether a corrective action should be initiated. When determination block 640 identifies that the corrective action should not be initiated, additional values may be accessed at block 610. When determination block 640 identifies that a corrective action should be initiated, that corrective action may be initiated at block 650.

Corrective actions initiated at block 650 may vary depending on the severity of a fault condition or failure. In certain instances, a sensing apparatus (e.g., a ToF sensor) may send an error message to a controller of an AV. This error message may result in the AV pulling to the side of a road and stopping, may result in messages being sent to owners of the AV, or may result in a sensing mode of the sensing apparatus being changed. As such, the fault condition or failure may be resolved based on the hardware fault or failure being detected.

FIG. 7 illustrates an example of a process 700 for identifying fault conditions within a ToF sensor. At block 702, the process 700 includes obtaining a first set of measurements corresponding to a pixel from a first image frame captured by a time-of-flight (ToF) sensor, wherein each respective measurement from the first set of measurements is associated with a different signal phase. For example, ToF camera 102 can obtain a first set of measurements corresponding to a pixel (e.g., from array 310) and each of the measurements can correspond to a different signal phase (e.g., DCS1, DCS2, DCS 3, and/or DCS 4 as illustrated in FIG. 4).

At block 704, the process 700 includes converting the first set of measurements using an analog to digital converter (ADC) to yield a first set of digitized measurements. For instance, ToF camera 102 can include ADC 350 that can generate outputs 380 (e.g., digitized outputs corresponding to the sampling of the light signal).

At block 706, the process 700 includes determining, based on the first set of digitized measurements, a first confidence map value that corresponds to the pixel from the first image frame, wherein the first confidence map value is indicative of at least one defect in the ToF sensor. For instance, ToF camera 102 can include a controller 216 that can be configured to determine a confidence map value that is indicative of at least one defect. In some examples, the confidence map value may be determined using one or more equations presented herein (e.g., one or more of Equation (2) through Equation (24)). In some cases, the at least one defect can correspond to at least one output of the ADC being in a stuck state. In some aspects, the at least one defect can correspond to one or more faults of one or more pixels of a sensing array in the ToF sensor.

In some examples, the process 700 can include obtaining a grayscale measurement corresponding to the pixel from the first image frame captured by the ToF sensor; converting the grayscale measurement using the ADC to yield a digitized grayscale measurement; and determining, based on the first set of digitized measurements and the digitized grayscale measurement, a second confidence map value that corresponds to the pixel from the first image frame, wherein the second confidence map value is indicative of the at least one defect in the ToF sensor. For instance, ToF camera 102 can obtain a grayscale measurement corresponding to the pixel (e.g., from array 310) and convert the grayscale measurement using an ADC. In some cases, the digitized grayscale measurement can be used to determine a second confidence map value.

In some aspects, the process 700 can include determining, based on the first confidence map value and the second confidence map value, that the at least one defect in the ToF sensor corresponds to at least one of an ADC error and a differential correlation sampling (DCS) error.

In some cases, the process 700 can include obtaining a second set of measurements corresponding to the pixel from a second image frame captured by the ToF sensor, wherein each respective measurement from the second set of measurements is associated with a different signal phase; converting the second set of measurements using the ADC to yield a second set of digitized measurements; determining, based on the second set of digitized measurements, a third confidence map value that corresponds to the pixel from the second image frame, wherein the third confidence map value is indicative of the at least one defect in the ToF sensor; and determining, based on the first confidence map value and the third confidence map value, that the at least one defect in the ToF sensor is an intermittent defect.

In some aspects, the process 700 can include sending an indication of the at least one defect to a computing device that is configured to control an autonomous vehicle, wherein the ToF sensor is part of a sensor system associated with the autonomous vehicle. For example, the ToF camera 102 can send an indication of the at least one defect to local computing device 810 of AV 802.

FIG. 8 is a diagram illustrating an example autonomous vehicle (AV) environment 800, according to some examples of the present disclosure. One of ordinary skill in the art will understand that, for AV environment 800 and any system discussed in the present disclosure, there can be additional or fewer components in similar or alternative configurations. The illustrations and examples provided in the present disclosure are for conciseness and clarity. Other examples may include different numbers and/or types of elements, but one of ordinary skill the art will appreciate that such variations do not depart from the scope of the present disclosure.

In this example, the AV environment 800 includes an AV 802, a data center 850, and a client computing device 870. The AV 802, the data center 850, and the client computing device 870 can communicate with one another over one or more networks (not shown), such as a public network (e.g., the Internet, an Infrastructure as a Service (IaaS) network, a Platform as a Service (PaaS) network, a Software as a Service (SaaS) network, other Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

The AV 802 can navigate roadways without a human driver based on sensor signals generated by multiple sensor systems 804, 806, and 808. The sensor systems 804-808 can include one or more types of sensors and can be arranged about the AV 802. For instance, the sensor systems 804-808 can include Inertial Measurement Units (IMUs), cameras (e.g., still image cameras, video cameras, etc.), light sensors (e.g., LIDAR systems, ambient light sensors, infrared sensors, etc.), RADAR systems, GPS receivers, audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 804 can be a camera system, the sensor system 806 can be a LIDAR system, and the sensor system 808 can be a RADAR system. Other examples may include any other number and type of sensors.

The AV 802 can also include several mechanical systems that can be used to maneuver or operate the AV 802. For instance, the mechanical systems can include a vehicle propulsion system 830, a braking system 832, a steering system 834, a safety system 836, and a cabin system 838, among other systems. The vehicle propulsion system 830 can include an electric motor, an internal combustion engine, or both. The braking system 832 can include an engine brake, brake pads, actuators, and/or any other suitable componentry configured to assist in decelerating the AV 802. The steering system 834 can include suitable componentry configured to control the direction of movement of the AV 802 during navigation. The safety system 836 can include lights and signal indicators, a parking brake, airbags, and so forth. The cabin system 838 can include cabin temperature control systems, in-cabin entertainment systems, and so forth. In some examples, the AV 802 might not include human driver actuators (e.g., steering wheel, handbrake, foot brake pedal, foot accelerator pedal, turn signal lever, window wipers, etc.) for controlling the AV 802. Instead, the cabin system 838 can include one or more client interfaces (e.g., Graphical User Interfaces (GUIs), Voice User Interfaces (VUIs), etc.) for controlling certain aspects of the mechanical systems 830-838.

The AV 802 can include a local computing device 810 that is in communication with the sensor systems 804-808, the mechanical systems 830-838, the data center 850, and the client computing device 870, among other systems. The local computing device 810 can include one or more processors and memory, including instructions that can be executed by the one or more processors. The instructions can make up one or more software stacks or components responsible for controlling the AV 802; communicating with the data center 850, the client computing device 870, and other systems; receiving inputs from riders, passengers, and other entities within the AV's environment; logging metrics collected by the sensor systems 804-808; and so forth. In this example, the local computing device 810 includes a perception stack 812, a localization stack 814, a prediction stack 816, a planning stack 818, a communications stack 820, a control stack 822, an AV operational database 824, and an HD geospatial database 826, among other stacks and systems.

Perception stack 812 can enable the AV 802 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 804-808, the localization stack 814, the HD geospatial database 826, other components of the AV, and other data sources (e.g., the data center 850, the client computing device 870, third party data sources, etc.). The perception stack 812 can detect and classify objects and determine their current locations, speeds, directions, and the like. In addition, the perception stack 812 can determine the free space around the AV 802 (e.g., to maintain a safe distance from other objects, change lanes, park the AV, etc.). The perception stack 812 can identify environmental uncertainties, such as where to look for moving objects, flag areas that may be obscured or blocked from view, and so forth. In some examples, an output of the perception stack 812 can be a bounding area around a perceived object that can be associated with a semantic label that identifies the type of object that is within the bounding area, the kinematic of the object (information about its movement), a tracked path of the object, and a description of the pose of the object (its orientation or heading, etc.).

Localization stack 814 can determine the AV's position and orientation (pose) using different methods from multiple systems (e.g., GPS, IMUs, cameras, LIDAR, RADAR, ultrasonic sensors, the HD geospatial database 826, etc.). For example, in some cases, the AV 802 can compare sensor data captured in real-time by the sensor systems 804-808 to data in the HD geospatial database 826 to determine its precise (e.g., accurate to the order of a few centimeters or less) position and orientation. The AV 802 can focus its search based on sensor data from one or more first sensor systems (e.g., GPS) by matching sensor data from one or more second sensor systems (e.g., LIDAR). If the mapping and localization information from one system is unavailable, the AV 802 can use mapping and localization information from a redundant system and/or from remote data sources.

Prediction stack 816 can receive information from the localization stack 814 and objects identified by the perception stack 812 and predict a future path for the objects. In some examples, the prediction stack 816 can output several likely paths that an object is predicted to take along with a probability associated with each path. For each predicted path, the prediction stack 816 can also output a range of points along the path corresponding to a predicted location of the object along the path at future time intervals along with an expected error value for each of the points that indicates a probabilistic deviation from that point.

Planning stack 818 can determine how to maneuver or operate the AV 802 safely and efficiently in its environment. For example, the planning stack 818 can receive the location, speed, and direction of the AV 802, geospatial data, data regarding objects sharing the road with the AV 802 (e.g., pedestrians, bicycles, vehicles, ambulances, buses, cable cars, trains, traffic lights, lanes, road markings, etc.) or certain events occurring during a trip (e.g., emergency vehicle blaring a siren, intersections, occluded areas, street closures for construction or street repairs, double-parked cars, etc.), traffic rules and other safety standards or practices for the road, user input, and other relevant data for directing the AV 802 from one point to another and outputs from the perception stack 812, localization stack 814, and prediction stack 816. The planning stack 818 can determine multiple sets of one or more mechanical operations that the AV 802 can perform (e.g., go straight at a specified rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 818 can select from multiple backup plans to carry out. For example, while preparing to change lanes to turn right at an intersection, another vehicle may aggressively cut into the destination lane, making the lane change unsafe. The planning stack 818 could have already determined an alternative plan for such an event. Upon its occurrence, it could help direct the AV 802 to go around the block instead of blocking a current lane while waiting for an opening to change lanes.

Control stack 822 can manage the operation of the vehicle propulsion system 830, the braking system 832, the steering system 834, the safety system 836, and the cabin system 838. The control stack 822 can receive sensor signals from the sensor systems 804-808 as well as communicate with other stacks or components of the local computing device 810 or a remote system (e.g., the data center 850) to effectuate operation of the AV 802. For example, the control stack 822 can implement the final path or actions from the multiple paths or actions provided by the planning stack 818. This can involve turning the routes and decisions from the planning stack 818 into commands for the actuators that control the AV's steering, throttle, brake, and drive unit.

Communications stack 820 can transmit and receive signals between the various stacks and other components of the AV 802 and between the AV 802, the data center 850, the client computing device 870, and other remote systems. The communications stack 820 can enable the local computing device 810 to exchange information remotely over a network, such as through an antenna array or interface that can provide a metropolitan WIFI network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). Communications stack 820 can also facilitate the local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Low Power Wide Area Network (LPWAN), Bluetooth®, infrared, etc.).

The HD geospatial database 826 can store HD maps and related data of the streets upon which the AV 802 travels. In some examples, the HD maps and related data can comprise multiple layers, such as an areas layer, a lanes and boundaries layer, an intersections layer, a traffic controls layer, and so forth. The areas layer can include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane centerline, lane boundaries, type of lane boundaries, etc.) and related attributes (e.g., direction of travel, speed limit, lane type, etc.). The lanes and boundaries layer can also include three-dimensional (3D) attributes related to lanes (e.g., slope, elevation, curvature, etc.). The intersections layer can include geospatial information of intersections (e.g., crosswalks, stop lines, turning lane centerlines and/or boundaries, etc.) and related attributes (e.g., permissive, protected/permissive, or protected only left turn lanes; legal or illegal u-turn lanes; permissive or protected only right turn lanes; etc.). The traffic controls lane can include geospatial information of traffic signal lights, traffic signs, and other road objects and related attributes.

AV operational database 824 can store raw AV data generated by the sensor systems 804-808, stacks 812-822, and other components of the AV 802 and/or data received by the AV 802 from remote systems (e.g., the data center 850, the client computing device 870, etc.). In some examples, the raw AV data can include HD LIDAR point cloud data, image data, RADAR data, GPS data, and other sensor data that the data center 850 can use for creating or updating AV geospatial data or for creating simulations of situations encountered by AV 802 for future testing or training of various machine learning algorithms that are incorporated in the local computing device 810.

Data center 850 can include a private cloud (e.g., an enterprise network, a co-location provider network, etc.), a public cloud (e.g., an Infrastructure as a Service (IaaS) network, a Platform as a Service (PaaS) network, a Software as a Service (SaaS) network, or other Cloud Service Provider (CSP) network), a hybrid cloud, a multi-cloud, and/or any other network. The data center 850 can include one or more computing devices remote to the local computing device 810 for managing a fleet of AVs and AV-related services. For example, in addition to managing the AV 802, the data center 850 may also support a ride-hailing service (e.g., a ridesharing service), a delivery service, a remote/roadside assistance service, street services (e.g., street mapping, street patrol, street cleaning, street metering, parking reservation, etc.), and the like.

Data center 850 can send and receive various signals to and from the AV 802 and the client computing device 870. These signals can include sensor data captured by the sensor systems 804-808, roadside assistance requests, software updates, ride-hailing/ridesharing pick-up and drop-off instructions, and so forth. In this example, the data center 850 includes a data management platform 852, an Artificial Intelligence/Machine Learning (AI/ML) platform 854, a simulation platform 856, a remote assistance platform 858, and a ride-hailing platform 860, and a map management platform 862, among other systems.

Data management platform 852 can be a "big data" system capable of receiving and transmitting data at high velocities (e.g., near real-time or real-time), processing a large variety of data and storing large volumes of data (e.g., terabytes, petabytes, or more of data). The varieties of data can include data having different structures (e.g., structured, semi-structured, unstructured, etc.), data of different types (e.g., sensor data, mechanical system data, ride-hailing service, map data, audio, video, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), and/or data having other characteristics. The various platforms and systems of the data center 850 can access data stored by the data management platform 852 to provide their respective services.

The AI/ML platform 854 can provide the infrastructure for training and evaluating machine learning algorithms for operating the AV 802, the simulation platform 856, the remote assistance platform 858, the ride-hailing platform 860, the map management platform 862, and other platforms and systems. Using the AI/ML platform 854, data scientists can prepare data sets from the data management platform 852; select, design, and train machine learning models; evaluate, refine, and deploy the models; maintain, monitor, and retrain the models; and so on.

Simulation platform 856 can enable testing and validation of the algorithms, machine learning models, neural networks, and other development efforts for the AV 802, the remote assistance platform 858, the ride-hailing platform 860, the map management platform 862, and other platforms and systems. Simulation platform 856 can replicate a variety of driving environments and/or reproduce real-world scenarios from data captured by the AV 802, including rendering geospatial information and road infrastructure (e.g., streets, lanes, crosswalks, traffic lights, stop signs, etc.) obtained from a cartography platform (e.g., map management platform 862); modeling the behavior of other vehicles, bicycles, pedestrians, and other dynamic elements; simulating inclement weather conditions, different traffic scenarios; and so on.

Remote assistance platform 858 can generate and transmit instructions regarding the operation of the AV 802. For example, in response to an output of the AI/ML platform 854 or other system of the data center 850, the remote assistance platform 858 can prepare instructions for one or more stacks or other components of the AV 802.

Ride-hailing platform 860 can interact with a customer of a ride-hailing service via a ride-hailing application 872 executing on the client computing device 870. The client computing device 870 can be any type of computing system such as, for example and without limitation, a server, desktop computer, laptop computer, tablet computer, smartphone, smart wearable device (e.g., smartwatch, smart eyeglasses or other Head-Mounted Display (HMD), smart ear pods, or other smart in-ear, on-ear, or over-ear device, etc.), gaming system, or any other computing device for accessing the ride-hailing application 872. The client computing device 870 can be a customer's mobile computing device or a computing device integrated with the AV 802 (e.g., the local computing device 810). The ride-hailing platform 860 can receive requests to pick up or drop off from the ride-hailing application 872 and dispatch the AV 802 for the trip.

Map management platform 862 can provide a set of tools for the manipulation and management of geographic and spatial (geospatial) and related attribute data. The data management platform 852 can receive LIDAR point cloud data, image data (e.g., still image, video, etc.), RADAR data, GPS data, and other sensor data (e.g., raw data) from one or more AVs 802, Unmanned Aerial Vehicles (UAVs), satellites, third-party mapping services, and other sources of geospatially referenced data. The raw data can be processed, and map management platform 862 can render base representations (e.g., tiles (2D), bounding volumes (3D), etc.) of the AV geospatial data to enable users to view, query, label, edit, and otherwise interact with the data. Map management platform 862 can manage workflows and tasks for operating on the AV geospatial data. Map management platform 862 can control access to the AV geospatial data, including granting or limiting access to the AV geospatial data based on user-based, role-based, group-based, task-based, and other attribute-based access control mechanisms. Map management platform 862 can provide version control for the AV geospatial data, such as to track specific changes that (human or machine) map editors have made to the data and to revert changes when necessary. Map management platform 862 can administer release management of the AV geospatial data, including distributing suitable iterations of the data to different users, computing devices, AVs, and other consumers of HD maps. Map management platform 862 can provide analytics regarding the AV geospatial data and related data, such as to generate insights relating to the throughput and quality of mapping tasks.

In some embodiments, the map viewing services of map management platform 862 can be modularized and deployed as part of one or more of the platforms and systems of the data center 850. For example, the AI/ML platform 854 may incorporate the map viewing services for visualizing the effectiveness of various object detection or object classification models, the simulation platform 856 may incorporate the map viewing services for recreating and visualizing certain driving scenarios, the remote assistance platform 858 may incorporate the map viewing services for replaying traffic incidents to facilitate and coordinate aid, the ride-hailing platform 860 may incorporate the map viewing services into the ride-hailing application 872 to enable passengers to view the AV 802 in transit en route to a pick-up or drop-off location, and so on.

While the autonomous vehicle 802, the local computing device 810, and the autonomous vehicle environment 800 are shown to include certain systems and components, one of ordinary skill will appreciate that the autonomous vehicle 802, the local computing device 810, and/or the autonomous vehicle environment 800 can include more or fewer systems and/or components than those shown in FIG. 8. For example, the autonomous vehicle 802 can include other services than those shown in FIG. 8 and the local computing device 810 can also include, in some instances, one or more memory devices (e.g., RAM, ROM, cache, and/or the like), one or more network interfaces (e.g., wired and/or wireless communications interfaces and the like), and/or other hardware or processing devices that are not shown in FIG. 8. An illustrative example of a computing device and hardware components that can be implemented with the local computing device 810 is described below with respect to FIG. 9.

Figure 9:
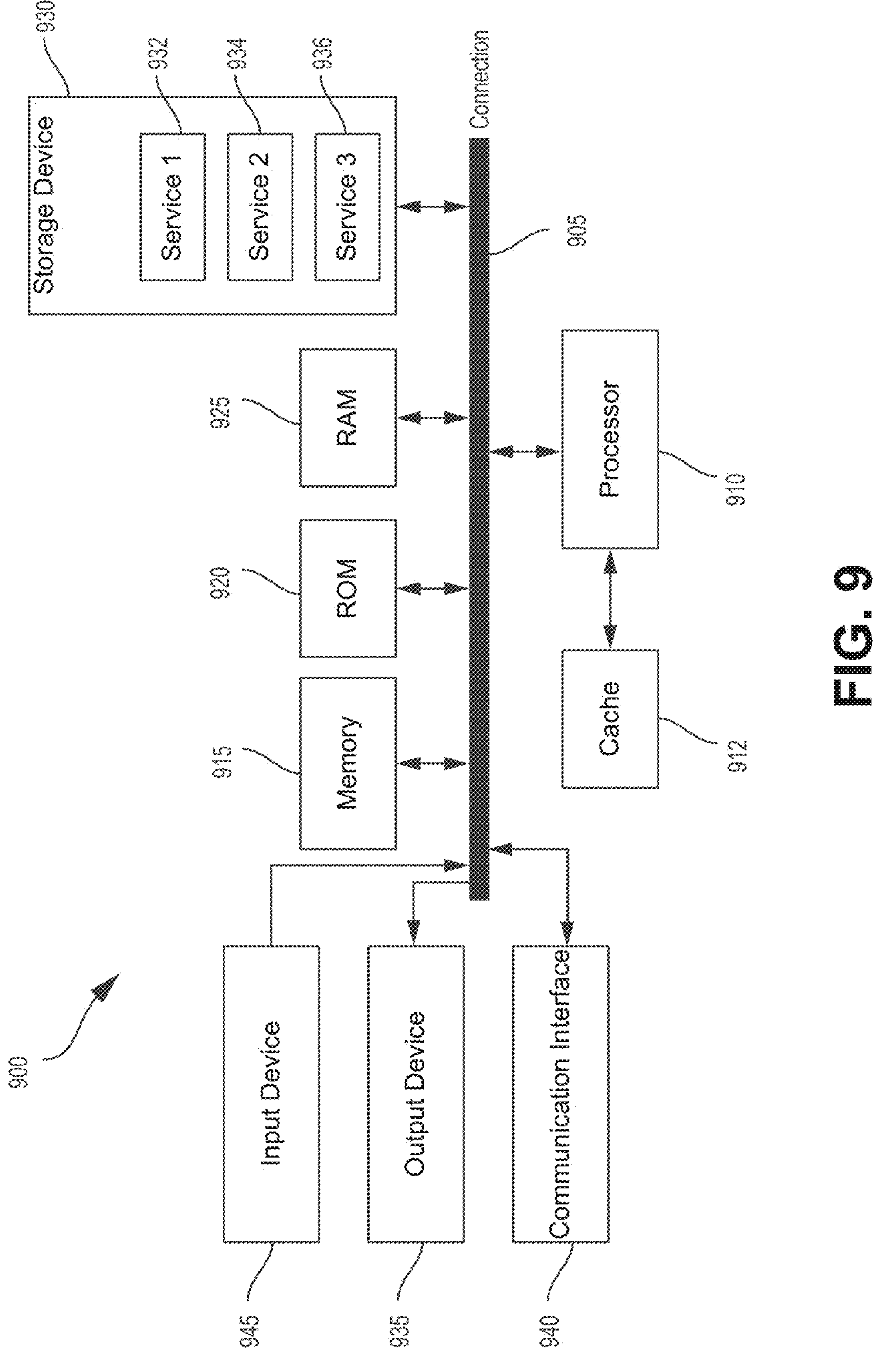
FIG. 9 illustrates an example processor-based system with which some aspects of the subject technology can be implemented.

FIG. 9 illustrates an example processor-based system with which some aspects of the subject technology can be implemented. For example, processor-based system 900 can be any computing device making up, or any component thereof in which the components of the system are in communication with each other using connection 905. Connection 905 can be a physical connection via a bus, or a direct connection into processor 910, such as in a chipset architecture. Connection 905 can also be a virtual connection, networked connection, or logical connection.

In some embodiments, computing system 900 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 900 includes at least one processing unit (Central Processing Unit (CPU) or processor) 910 and connection 905 that couples various system components including system memory 915, such as Read-Only Memory (ROM) 920 and Random-Access Memory (RAM) 925 to processor 910. Computing system 900 can include a cache of high-speed memory 912 connected directly with, in close proximity to, or integrated as part of processor 910.

Processor 910 can include any general-purpose processor and a hardware service or software service, such as services 932, 934, and 936 stored in storage device 930, configured to control processor 910 as well as a special-purpose processor where software instructions are incorporated into the actual processor design. Processor 910 may essentially be a completely self-contained computing system, containing multiple cores or processors, a bus, memory controller, cache, etc. A multi-core processor may be symmetric or asymmetric.

To enable user interaction, computing system 900 includes an input device 945, which can represent any number of input mechanisms, such as a microphone for speech, a touch-sensitive screen for gesture or graphical input, keyboard, mouse, motion input, speech, etc. Computing system 900 can also include output device 935, which can be one or more of a number of output mechanisms known to those of skill in the art. In some instances, multimodal systems can enable a user to provide multiple types of input/output to communicate with computing system 900. Computing system 900 can include communications interface 940, which can generally govern and manage the user input and system output. The communication interface may perform or facilitate receipt and/or transmission wired or wireless communications via wired and/or wireless transceivers, including those making use of an audio jack/plug, a microphone jack/plug, a Universal Serial Bus (USB) port/plug, an Apple® Lightning® port/plug, an Ethernet port/plug, a fiber optic port/plug, a proprietary wired port/plug, a BLUETOOTH® wireless signal transfer, a BLUETOOTH® low energy (BLE) wireless signal transfer, an IBEACON® wireless signal transfer, a Radio-Frequency Identification (RFID) wireless signal transfer, Near-Field Communications (NFC) wireless signal transfer, Dedicated Short Range Communication (DSRC) wireless signal transfer, 802.11 Wi-Fi® wireless signal transfer, Wireless Local Area Network (WLAN) signal transfer, Visible Light Communication (VLC) signal transfer, Worldwide Interoperability for Microwave Access (WiMAX), Infrared (IR) communication wireless signal transfer, Public Switched Telephone Network (PSTN) signal transfer, Integrated Services Digital Network (ISDN) signal transfer, 3G/4G/5G/LTE cellular data network wireless signal transfer, ad-hoc network signal transfer, radio wave signal transfer, microwave signal transfer, infrared signal transfer, visible light signal transfer signal transfer, ultraviolet light signal transfer, wireless signal transfer along the electromagnetic spectrum, or some combination thereof.

Communication interface 940 may also include one or more Global Navigation Satellite System (GNSS) receivers or transceivers that are used to determine a location of the computing system 900 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 930 can be a non-volatile and/or non-transitory and/or computer-readable memory device and can be a hard disk or other types of computer readable media which can store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a Compact Disc (CD) Read Only Memory (CD-ROM) optical disc, a rewritable CD optical disc, a Digital Video Disk (DVD) optical disc, a Blu-ray Disc (BD) optical disc, a holographic optical disk, another optical medium, a Secure Digital (SD) card, a micro SD (microSD) card, a Memory Stick® card, a smartcard chip, a EMV chip, a Subscriber Identity Module (SIM) card, a mini/micro/nano/pico SIM card, another Integrated Circuit (IC) chip/card, Random-Access Memory (RAM), Atatic RAM (SRAM), Dynamic RAM (DRAM), Read-Only Memory (ROM), Programmable ROM (PROM), Erasable PROM (EPROM), Electrically Erasable PROM (EEPROM), flash EPROM (FLASHEPROM), cache memory (L1/L2/L3/L4/L5/L #), Resistive RAM (RRAM/ReRAM), Phase Change Memory (PCM), Spin Transfer Torque RAM (STT-RAM), another memory chip or cartridge, and/or a combination thereof.

Storage device 930 can include software services, servers, services, etc., that when the code that defines such software is executed by the processor 910, it causes the system 900 to perform a function. In some embodiments, a hardware service that performs a particular function can include the software component stored in a computer-readable medium in connection with the necessary hardware components, such as processor 910, connection 905, output device 935, etc., to carry out the function.

Embodiments within the scope of the present disclosure may also include tangible and/or non-transitory computer-readable storage media or devices for carrying or having computer-executable instructions or data structures stored thereon. Such tangible computer-readable storage devices can be any available device that can be accessed by a general purpose or special purpose computer, including the functional design of any special purpose processor as described above. By way of example, and not limitation, such tangible computer-readable devices can include RAM, ROM, EEPROM, CD-ROM or other optical disk storage, magnetic disk storage or other magnetic storage devices, or any other device which can be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general-purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform tasks or implement abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network Personal Computers (PCs), minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

Illustrative examples of the disclosure include:

Aspect 1. A method comprising: obtaining a first set of measurements corresponding to a pixel from a first image frame captured by a time-of-flight (ToF) sensor, wherein each respective measurement from the first set of measurements is associated with a different signal phase; converting the first set of measurements using an analog to digital converter (ADC) to yield a first set of digitized measurements; and determining, based on the first set of digitized measurements, a first confidence map value that corresponds to the pixel from the first image frame, wherein the first confidence map value is indicative of at least one defect in the ToF sensor.

Aspect 2. The method of Aspect 1, further comprising: obtaining a grayscale measurement corresponding to the pixel from the first image frame captured by the ToF sensor; converting the grayscale measurement using the ADC to yield a digitized grayscale measurement; and determining, based on the first set of digitized measurements and the digitized grayscale measurement, a second confidence map value that corresponds to the pixel from the first image frame, wherein the second confidence map value is indicative of the at least one defect in the ToF sensor.

Aspect 3. The method of Aspect 2, further comprising: determining, based on the first confidence map value and the second confidence map value, that the at least one defect in the ToF sensor corresponds to at least one of an ADC error and a differential correlation sampling (DCS) error.

Aspect 4. The method of any of Aspects 1 to 3, further comprising: obtaining a second set of measurements corresponding to the pixel from a second image frame captured by the ToF sensor, wherein each respective measurement from the second set of measurements is associated with a different signal phase; converting the second set of measurements using the ADC to yield a second set of digitized measurements; determining, based on the second set of digitized measurements, a third confidence map value that corresponds to the pixel from the second image frame, wherein the third confidence map value is indicative of the at least one defect in the ToF sensor; and determining, based on the first confidence map value and the third confidence map value, that the at least one defect in the ToF sensor is an intermittent defect.

Aspect 5. The method of any of Aspects 1 to 4 wherein the at least one defect corresponds to at least one output of the ADC being in a stuck state.

Aspect 6. The method of any of Aspects 1 to 5, wherein the at least one defect corresponds to one or more faults of one or more pixels of a sensing array in the ToF sensor.

Aspect 7. The method of any of Aspects 1 to 6, further comprising: sending an indication of the at least one defect to a computing device that is configured to control an autonomous vehicle, wherein the ToF sensor is part of a sensor system associated with the autonomous vehicle.

Aspect 8. An apparatus comprising: at least one memory; and at least one processor coupled to the at least one memory, wherein the at least one processor is configured to perform operations in accordance with any one of Aspects 1 to 7.

Aspect 9. An apparatus comprising means for performing operations in accordance with any one of Aspects 1 to 7.

Aspect 10. A non-transitory computer-readable medium comprising instructions that, when executed by an apparatus, cause the apparatus to perform operations in accordance with any one of Aspects 1 to 7.

The various embodiments described above are provided by way of illustration only and should not be construed to limit the scope of the disclosure. For example, the principles herein apply equally to optimization as well as general improvements. Various modifications and changes may be made to the principles described herein without following the example embodiments and applications illustrated and described herein, and without departing from the spirit and scope of the disclosure.

Claim language or other language in the disclosure reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

What is claimed is:

1. A system comprising:

a memory; and one or more processors coupled to the memory, the one or more processors being configured to:

obtain a first set of measurements corresponding to a pixel from a first image frame captured by a time-of-flight (ToF) sensor, wherein each respective measurement from the first set of measurements is associated with a different signal phase;

convert the first set of measurements using an analog to digital converter (ADC) to yield a first set of digitized measurements;

determine, based on the first set of digitized measurements, a first confidence map value that corresponds to the pixel from the first image frame, wherein the first confidence map value is indicative of at least one defect in the ToF sensor;

obtain a grayscale measurement corresponding to the pixel from the first image frame captured by the ToF sensor;

convert the grayscale measurement using the ADC to yield a digitized grayscale measurement; and determine, based on the first set of digitized measurements and the digitized grayscale measurement, a second confidence map value that corresponds to the pixel from the first image frame, wherein the second confidence map value is indicative of the at least one defect in the ToF sensor; and determine, based on the first confidence map value and the second confidence map value, that the at least one defect in the ToF sensor corresponds to at least one of an ADC error and a differential correlation sampling (DCS) error.

2. The system of claim 1, wherein the one or more processors are further configured to:

obtain a second set of measurements corresponding to the pixel from a second image frame captured by the ToF sensor, wherein each respective measurement from the second set of measurements is associated with a different signal phase;

convert the second set of measurements using the ADC to yield a second set of digitized measurements;

determine, based on the second set of digitized measurements, a third confidence map value that corresponds to the pixel from the second image frame, wherein the third confidence map value is indicative of the at least one defect in the ToF sensor; and determine, based on the first confidence map value and the third confidence map value, that the at least one defect in the ToF sensor is an intermittent defect.

3. The system of claim 1, wherein the at least one defect corresponds to at least one output of the ADC being in a stuck state.

4. The system of claim 1, wherein the at least one defect corresponds to one or more faults of one or more pixels of a sensing array in the ToF sensor.

5. The system of claim 1, wherein the one or more processors are further configured to:

send an indication of the at least one defect to a computing device that is configured to control an autonomous vehicle, wherein the ToF sensor is part of a sensor system associated with the autonomous vehicle.

6. A method comprising:

obtaining a first set of measurements corresponding to a pixel from a first image frame captured by a time-of-flight (ToF) sensor, wherein each respective measurement from the first set of measurements is associated with a different signal phase;

converting the first set of measurements using an analog to digital converter (ADC) to yield a first set of digitized measurements;

determining, based on the first set of digitized measurements, a first confidence map value that corresponds to the pixel from the first image frame, wherein the first confidence map value is indicative of at least one defect in the ToF sensor;

obtaining a grayscale measurement corresponding to the pixel from the first image frame captured by the ToF sensor;

converting the grayscale measurement using the ADC to yield a digitized grayscale measurement; and determining, based on the first set of digitized measurements and the digitized grayscale measurement, a second confidence map value that corresponds to the pixel from the first image frame, wherein the second confidence map value is indicative of the at least one defect in the ToF sensor; and determining, based on the first confidence map value and the second confidence map value, that the at least one defect in the ToF sensor corresponds to at least one of an ADC error and a differential correlation sampling (DCS) error.

7. The method of claim 6, further comprising:

obtaining a second set of measurements corresponding to the pixel from a second image frame captured by the ToF sensor, wherein each respective measurement from the second set of measurements is associated with a different signal phase;

converting the second set of measurements using the ADC to yield a second set of digitized measurements;

determining, based on the second set of digitized measurements, a third confidence map value that corresponds to the pixel from the second image frame, wherein the third confidence map value is indicative of the at least one defect in the ToF sensor; and determining, based on the first confidence map value and the third confidence map value, that the at least one defect in the ToF sensor is an intermittent defect.

8. The method of claim 6, wherein the at least one defect corresponds to at least one output of the ADC being in a stuck state.

9. The method of claim 6, wherein the at least one defect corresponds to one or more faults of one or more pixels of a sensing array in the ToF sensor.

10. The method of claim 6, further comprising:

sending an indication of the at least one defect to a computing device that is configured to control an autonomous vehicle, wherein the ToF sensor is part of a sensor system associated with the autonomous vehicle.

11. A non-transitory computer-readable media comprising instructions stored thereon which, when executed are configured to cause a computer or processor to:

obtain a first set of measurements corresponding to a pixel from a first image frame captured by a time-of-flight (ToF) sensor, wherein each respective measurement from the first set of measurements is associated with a different signal phase;

convert the first set of measurements using an analog to digital converter (ADC) to yield a first set of digitized measurements;

determine, based on the first set of digitized measurements, a first confidence map value that corresponds to the pixel from the first image frame, wherein the first confidence map value is indicative of at least one defect in the ToF sensor;

obtain a second set of measurements corresponding to the pixel from a second image frame captured by the ToF sensor, wherein each respective measurement from the second set of measurements is associated with a different signal phase;

convert the second set of measurements using the ADC to yield a second set of digitized measurements;

determine, based on the second set of digitized measurements, a third confidence map value that corresponds to the pixel from the second image frame, wherein the third confidence map value is indicative of the at least one defect in the ToF sensor; and determine, based on the first confidence map value and the third confidence map value, that the at least one defect in the ToF sensor is an intermittent defect.

12. The non-transitory computer-readable media of claim 11, comprising further instructions configured to cause the computer or the processor to:

obtain a grayscale measurement corresponding to the pixel from the first image frame captured by the ToF sensor;

convert the grayscale measurement using the ADC to yield a digitized grayscale measurement; and determine, based on the first set of digitized measurements and the digitized grayscale measurement, a second confidence map value that corresponds to the pixel from the first image frame, wherein the second confidence map value is indicative of the at least one defect in the ToF sensor.

13. The non-transitory computer-readable media of claim 11, wherein the at least one defect corresponds to at least one output of the ADC being in a stuck state.

14. The non-transitory computer-readable media of claim 11, wherein the at least one defect corresponds to one or more faults of one or more pixels of a sensing array in the ToF sensor.

15. The non-transitory computer-readable media of claim 11, comprising further instructions configured to cause the computer or the processor to:

send an indication of the at least one defect to a computing device that is configured to control an autonomous vehicle, wherein the ToF sensor is part of a sensor system associated with the autonomous vehicle.

* * * * *